US012685129B2

(12) United States Patent
Jung

(10) Patent No.: US 12,685,129 B2
(45) Date of Patent: Jul. 14, 2026

(54) SEMICONDUCTOR DEVICE AND METHOD OF MANUFACTURING SEMICONDUCTOR DEVICE

(71) Applicant: SK hynix Inc., Icheon-si (KR)

(72) Inventor: Sung Wook Jung, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 439 days.

(21) Appl. No.: 18/459,845

(22) Filed: Sep. 1, 2023

(65) Prior Publication Data

US 2024/0371751 A1     Nov. 7, 2024

(30) Foreign Application Priority Data

May 4, 2023     (KR) .................. KR10-2023-0058105

(51) Int. Cl.
| | | |
|---|---|---|
| *H10W 20/42* | (2026.01) | |
| *H10B 69/00* | (2023.01) | |
| *H10B 80/00* | (2026.01) | |
| *H10W 20/00* | (2026.01) | |
| *H10W 90/00* | (2026.01) | |

(52) U.S. Cl.
CPC ......... *H10W 20/42* (2026.01); *H10W 20/076* (2026.01); *H10W 20/082* (2026.01); *H10W 20/083* (2026.01); *H10B 69/00* (2023.02); *H10B 80/00* (2023.02); *H10W 90/792* (2026.01)

(58) Field of Classification Search
CPC . H10W 20/42; H10W 20/076; H10W 20/082; H10W 20/083; H10W 20/0832; H10W 90/79; H10W 20/0698; H10W 74/01; H10W 74/114; H10W 20/20; H10W 20/435; H10B 69/00; H10B 80/00; H10B 43/10; H10B 43/27; H10B 43/50; H10B 41/27; H10B 41/30; H10B 41/40; H10B 43/30; H10B 43/40
See application file for complete search history.

(56) References Cited

U.S. PATENT DOCUMENTS

| | | | |
|---|---|---|---|
| 9,768,233 B1 | 9/2017 | Fukuda et al. | |
| 2014/0264898 A1* | 9/2014 | Hu ...................... | H10W 20/031 257/773 |

FOREIGN PATENT DOCUMENTS

| | | |
|---|---|---|
| KR | 1020210079087 A | 6/2021 |
| KR | 1020220099039 A | 7/2022 |

* cited by examiner

*Primary Examiner* — Thanhha S Pham
(74) *Attorney, Agent, or Firm* — WILLIAM PARK AND ASSOCIATES LTD.

(57)     ABSTRACT

A semiconductor device may include a gate structure including conductive layers and insulating layers that are alternately stacked and including a stair structure for exposing at least one of the conductive layers, a contact plug that extends through the gate structure and that is electrically connected to a uppermost conductive layer that is exposed by the stair structure, and insulating spacers that are disposed between remaining conductive layers, among the conductive layers, and the contact plug. The insulating layers may each have a first thickness, and the insulating spacers may each have a second thickness smaller than the first thickness.

12 Claims, 19 Drawing Sheets

SEMICONDUCTOR DEVICE AND METHOD OF MANUFACTURING SEMICONDUCTOR DEVICE

CROSS-REFERENCE TO RELATED APPLICATION

This application claims priority under 35 U.S.C. § 119 (a) to Korean Patent Application No. 10-2023-0058105 filed on May 4, 2023, in the Korean Intellectual Property Office, which is incorporated herein by reference in its entirety.

BACKGROUND

1. Technical Field

Embodiments relate to a semiconductor memory device and a method of manufacturing a semiconductor memory device.

2. Related Art

The density of degree of integration of semiconductor devices is basically determined by the area occupied by a memory cell. As single-layer semiconductor memory device integration reaches its limit, three-dimensional semiconductor memory devices may be more reliable and provide a much greater integration density that a two-dimensional device simply because the multiple layers in a three-dimensional device occupy the same "footprint" or area of an inherently lower-density, two-dimensional device. Three dimensional or multi-layer semiconductor devices may thus provide inherently superior reliability and integration density than a two-dimensional device.

SUMMARY

In an embodiment, a semiconductor device may include a gate structure comprising interleaved conductive layers and insulating layers, which comprise a stair structure; a contact plug extending through the interleaved conductive layers and insulating layers, the contact plug being electrically connected to a uppermost conductive layer of the stair structure and electrically isolated from a remaining conductive layers of the stair structure, among the conductive layers; and insulating spacers that are disposed between the remaining conductive layers and the contact plug; wherein the insulating layers each have a first thickness, and the insulating spacers each have a second thickness less than the first thickness.

In an embodiment, a semiconductor device may include a gate structure comprising interleaved conductive layers and insulating layers; a contact plug comprising a first part and a second part, the first part being electrically connected to a uppermost conductive layer and the second part being separated from the uppermost conductive layer; insulating spacers that protrude into the second part of the contact plug, and which is disposed between the remaining conductive layers, among the conductive layers, and the contact plug.

In an embodiment, a method of manufacturing a semiconductor device may include forming a stack comprising interleaved first material layers and second material layers; forming a stair structure that exposes at least one of the second material layers; forming a first opening that is spaced apart from an end of a uppermost second material layer that is exposed by the stair structure and that extends into the stack; forming an insulating spacers by oxidizing a surface of the second material layers exposed through the first opening; forming a contact plug within the first opening; forming a second openings by removing the second material layers, exposing the contact plug by extending the second openings; and forming a third material layers within the second openings.

In an embodiment, a method of manufacturing a semiconductor device may include forming a stack comprising interleaved first material layers and second material layers; forming a stair structure that exposes at least one of the second material layers; forming a first opening comprising a first part that is spaced apart from an end of a uppermost second material layer that is exposed by the stair structure and a second part that extends into the stack; forming insulating spacers by oxidizing the second material layers that are exposed through the first opening; extending the first opening by selectively etching a sidewall of the first part of the first opening; forming a contact plug within the first opening; forming second openings by removing the second material layers; and forming third material layers within the second openings, respectively.

DETAILED DESCRIPTION

Hereinafter, embodiments according to the technical spirit of the present disclosure are described with reference to the accompanying drawings.

Figure 1A:
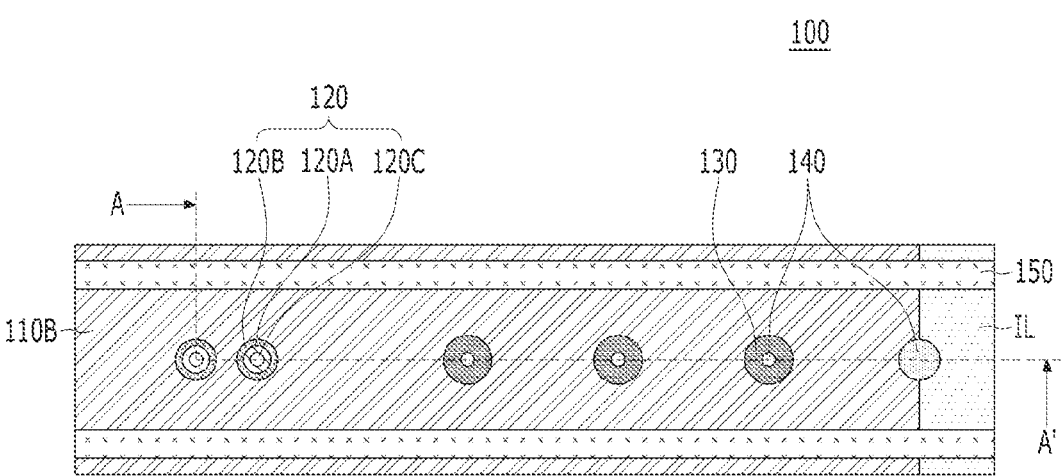
FIGS. 1A and 1B respectively are horizontal and vertical cross-sectional diagrams of a semiconductor device according to an embodiment of the present disclosure.
Figure 1B:
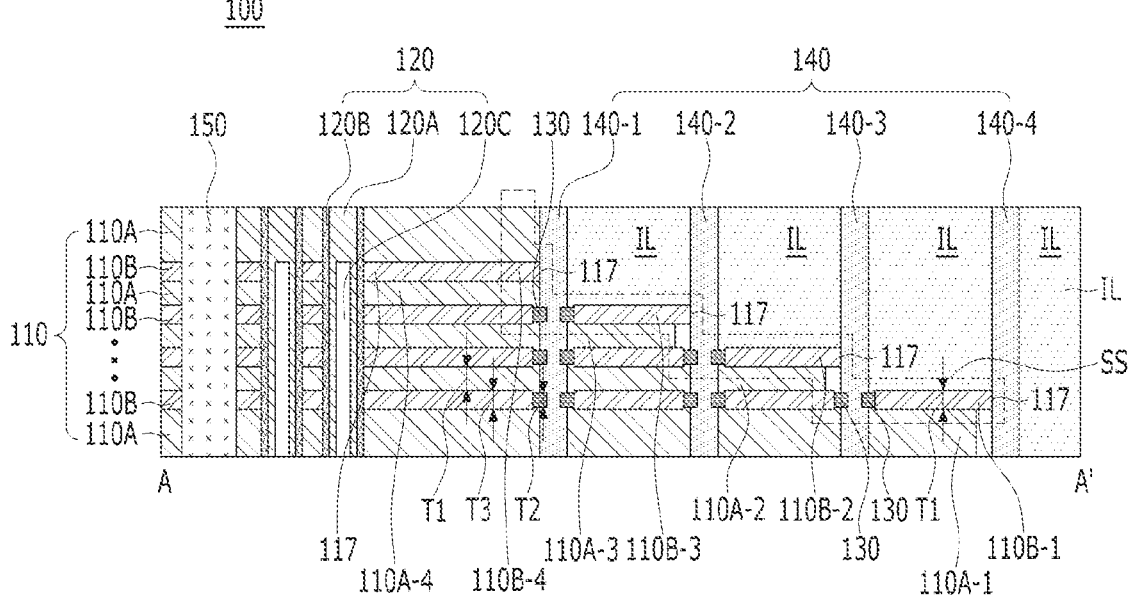

FIG. 1A is a horizontal cross-sectional view, sometimes referred to as a plan view, depicting a semiconductor device 100. FIG. 1B is a vertical cross-sectional view of the device 100 taken along section line A-A' in FIG. 1A.

As shown in FIGS. 1A and 1B, the semiconductor device 100 may include a gate structure 110, best seen in FIG. 1B. The semiconductor device 100 may also include: channel structures 120, insulating spacers 130, and contact plugs 140. The semiconductor device may also include a slit structure 150 and an interlayer insulating layer IL.

As best seen in FIG. 1B, the gate structure 110 may include interleaved insulating layers 110A and conductive layers 110B. The gate structure 110 may also comprise a "stair structure" SS, so named because the vertical cross-sectional shape of several interleaved conductive and insulating layers 110A and 110B, is similar to the shape of a set of stairs, which comprise horizontally-oriented stair "treads," which in FIG. 1B are vertically separated from each other by the thickness of an insulating layer 110A, which corresponds to a "stair riser." The vertical cross-sectional shape of the interlayer insulating layer IL, which is formed over (overlaid) the stair-stepped insulating layers 110A and conductive layers 110B, is thus a "mirror image" of the stair structure SS.

In FIG. 1B, the horizontal sections of a "stair structure" SS comprise extended-length conductive layers 110B, the lengths of which are incrementally shorter (or longer) than the length of the next lower (or upper) conductive layer 110B. In FIG. 1B, reference numerals 110B-1, 110B-2 and 110B-3 identify three (3) extended-length conductive layers 110B. Reference numeral 110B-1 identifies the longest extended length conductive layer 110B, which extends past three contact plugs identified by reference numerals 140-1, 140-2 and 140-3. Extended-length conductive layers 110B-1, 110B-2 and 110B-3 are formed over corresponding extended-length insulating layers 110A-1, 110A-2 and 110A-3.

Conductive layers 110B that extend beyond a contact plug 140 are electrically isolated from such a contact plug 140 by insulating spacers 130 formed between surfaces of a conductive layer 110B and the contact plug 140, that the conductive layer 110B extends past. The distal end 117 of extended-length conductive layers 110B-1, 110B-2 and 110B-3 is the end 117 of the layer conductive layers 110B that is farthest from the channel structures 120. In FIG. 1B, the distal end 117 of the first or lowest conductive layer 110B-1 is not separated from the fourth contact plug 140-4 because the distal end 17 of the lowest conductive layer 110B-1 is electrically connected to the fourth contact plug 104-1 but electrically isolated from the other contact plugs 104-1, 104-2 and 104-3 by insulating spacers 130. The lowest conductive layer 110B-1 is thus electrically connected to the fourth contact plug 104-4 but not electrically connected to the other contact plugs 104-1, 104-2 and 104-3.

The device 100 may comprise two or more conductive layers 110B. The insulating layers 110A between conductive layers 110B, may have similar or different thicknesses, T1. The insulating layers 110A may comprise an insulating material such as a metal oxide. Different insulating layers 110A may be formed of different insulating materials. The conductive layers 110B may each comprise a conductive material, such as tungsten or molybdenum.

As best seen in FIG. 1B, the interleaved layers 110A and 110B are substantially planar and substantially horizontal. The contact plugs 140 are formed orthogonal to the interleaved layers 110A and 110B and may extend through all of the interleaved layers of the gate structure 110, including portions of the interlayer insulating layer IL.

Together, FIG. 1A and FIG. 1B, show that the contact plugs 140 are cylindrically-shaped and extend downwardly through, and orthogonal to, alternately stacked insulating and conductive layers 110A and 110B respectively. As best seen in FIG. 1B, right-most contact plug 140-4 may extend into and pass through only the interlayer insulating layer IL.

The contact plugs 140 may have an unevenly shaped exterior sidewall surface, however, sidewall unevenness is not visible in FIG. 1A or FIG. 1B. Each contact plug 140 may or may not be electrically connected to the distal end 117 of 110B an extended-length conductive layer 110B-1, 110B-2, 110B-3, 110B-4.

A conductive layer 110B, which extends beyond a contact plug 140 may surround a ring-shaped insulating spacer 130, formed between the conductive layer 110B and contact plug 140. For example, the second, extended-length conductive layer 110B-2, may extend beyond and thus surround contact plugs 140-1 and 140-2 but terminate at and be electrically connected to only the third contact plug 140-3 and not be electrically connected to the first two contact plugs 140-1 and 140-2. Insulating spacers 130 between the second extended-length conductive layer 110B-2 and the first two contact plugs 140-1 and 140-2, electrically isolate the conductive layer 110B-2 and the contact plugs 140-1 and 140-2 from each other.

The conductive layer thickness T1, the insulating layer thickness, T2, and insulating spacer thickness, T3 may all vary. Insulating layers 110A may have a first thickness, T1. Conductive layers 110B may have a third and different thickness, T3. The insulating spacers 130 may have a second thickness T2, which may be less than T1 and/or T3, substantially the same as T1 and/or T3, or less than, equal to or greater than T3. The insulating spacers 130 may comprise a dielectric or an insulating metal oxide.

Still referring to FIGS. 1A and 1B, the channel structures 120 may extend through the gate structure 110. Each of the channel structures 120 may include a channel core 120C, a channel layer 120A, which encloses or surrounds the channel core 120C and a memory layer 120B that surrounds the channel layer 120A.

A slit structure 150 may extend through the gate structure 110. The slit structure 150 may include a support or a source contact structure. For example, the slit structure 150 may include a support including an insulating material, such as oxide. As another example, the slit structure 150 may include a source contact structure that is connected to a source structure. Also, the slit structure 150 may include semiconductor material.

Figure 2A:
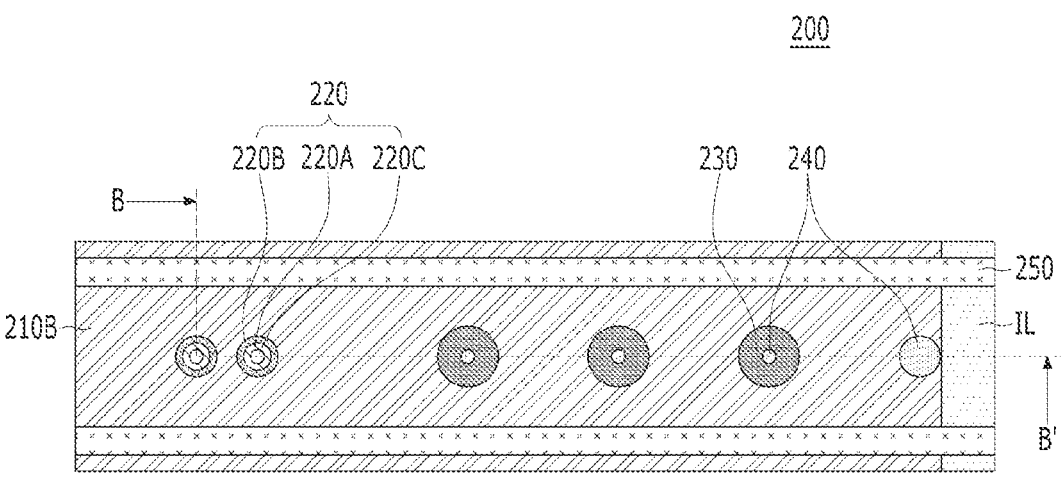
FIGS. 2A and 2B respectively are horizontal and vertical cross-sectional diagrams of a semiconductor device according to an embodiment of the present disclosure.
Figure 2B:
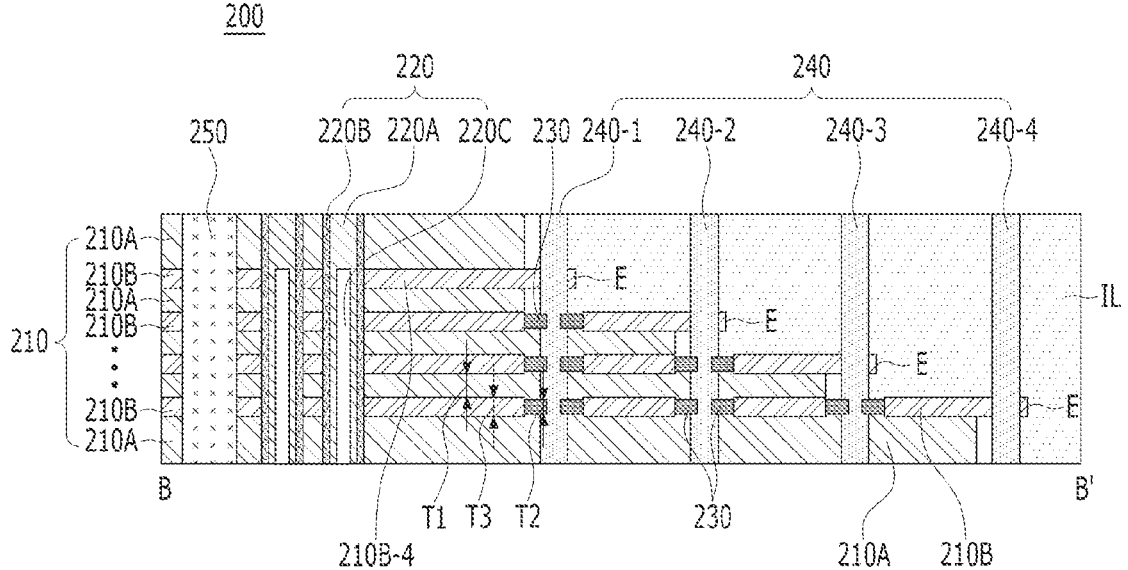

FIGS. 2A and 2B respectively are horizontal and vertical cross-sectional diagrams of a semiconductor device according to an embodiment of the present disclosure, FIG. 2B being a vertical cross section through section lines B-B' in FIG. 2A. Hereinafter, redundant descriptions of the structures depicted in IGS. 2A and 2B are omitted in the interest of brevity.

Referring to FIGS. 2A and 2B, the semiconductor device 200 may include a gate structure 210, channel structures 220, insulating spacers 230, and contact plugs 240. The semiconductor device may further include a slit structure 250 and interlayer insulating layer IL. The gate structure 210 may include interleaved, extended-length insulating layers 210A and conductive layers 210B. The channel structures 220 may each include a channel layer 220A, a memory layer 220B, and an insulating core 220C.

The contact plugs 240 may extend through all of the gate structure 210 layers 210A, 210B. As best seen in FIG. 2A, the contact plugs 240 may extend into and through the interlayer insulating layer IL.

The contact plugs 240 may each have an unevenly shaped sidewall. Sidewall unevenness, however, is not visible in FIG. 2A or FIG. 2B. The uppermost conductive layer 210B-4 is electrically connected to the first contact plug 240-1 and may thus surround all or at least a part of the sidewall of the contact plug 240-1. For example, in FIG. 2B, the uppermost conductive layer 210B-4 has a short extension, E, making the conductive layer 210B-4 extend past contact plug 240-1 and extend horizontally into the interlayer insulating layer IL by the length of the short extension E.

The insulating spacers 230 may be disposed between the conductive layers 210B and the contact plug 240. For example, the insulating spacers 230 may be disposed between the third conductive layer 210B-3 and the first contact plug 240-1. However, no insulating spacer 230 is disposed between the third conductive layer 210B-3 and the second contact plug 240-2 because the third conductive layer 210B-3 is electrically connected to the second contact plug 240-2. The insulating spacers 230 surrounding the sidewall of the contact plugs 240 may protrude into the contact plug 240, as shown in FIG. 2A.

According to the aforementioned structure, the uppermost conductive layer 210B-4 may be formed so that the uppermost conductive layer 210B surrounds the entire sidewall of the first contact plug 240-1. In other embodiments, the uppermost conductive layer 210B may be formed so that the uppermost conductive layer 210B-4 may surround less than the entire sidewall of the contact plug 240. As with the embodiment depicted in FIGS. 1A and 1B, insulating spacers 230 are formed between conductive layers 210B and contact plugs 240 that are to be electrically isolated from each other. No insulating spacer 240 is formed between a conductive layer 210B and a contact plug 240 that are electrically connected to each other.

Figure 3A:
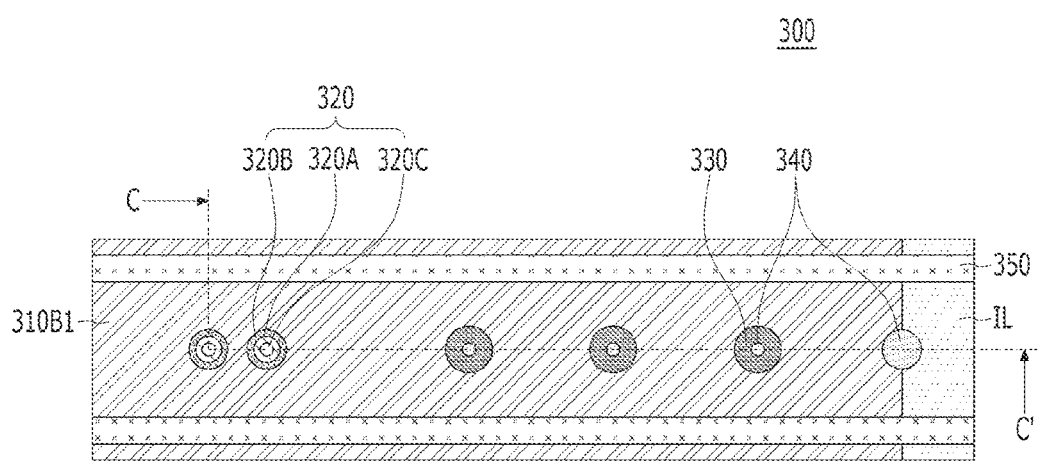
FIGS. 3A and 3B respectively are horizontal and vertical cross-sectional diagrams of a semiconductor device according to an embodiment of the present disclosure.
Figure 3B:
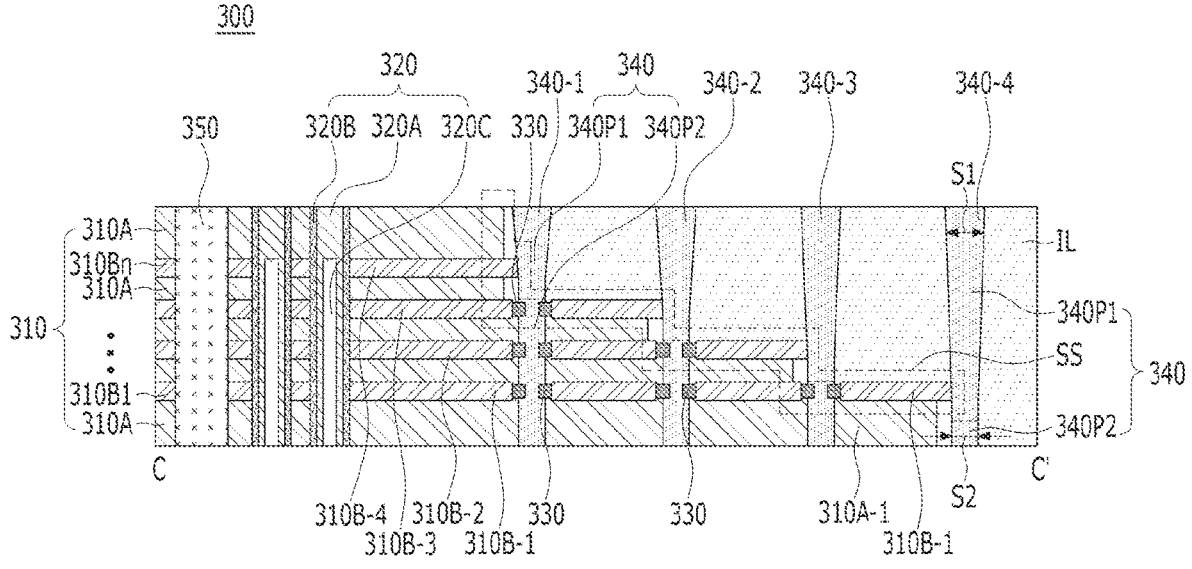

FIGS. 3A and 3B respectively are horizontal and vertical cross-sectional diagrams of a semiconductor device according to an embodiment of the present disclosure. FIG. 3A may be a horizontal cross section, also known as a plan view, of the semiconductor device. FIG. 3B may be a vertical cross-sectional view taken along section line C-C' in FIG. 3A. Hereinafter, redundant descriptions are omitted in the interest of brevity.

Referring to FIGS. 3A and 3B, the semiconductor device may include a gate structure 310, channel structures 320, insulating spacers 330 and contact plugs 340. The semiconductor device may further include a slit structure 350 and an interlayer insulating layer IL. The channel structures 320 may include a channel layer 320A, a memory layer 320B, and an insulating core 320C As with the embodiment depicted in FIGS. 1A and 1B and the embodiment depicted in FIGS. 2A and 2B, the gate structure 310 of the embodiment depicted in FIGS. 3A and 3B may include interleaved, extended-length insulating layers 310A and conductive layers 310B.

Contact plugs 340 may extend through the extended-length layers 310A, 310B. As with the embodiments depicted in FIGS. 1A, 1B, 2A and 2B, contact plugs for the embodiment depicted in FIGS. 3A and 3B, which are identified by reference numeral 340, may be selectively isolated from or connected to individual conductive layers 310B, by including or omitting insulating spacers 330 between layers and plugs as appropriate. Each of the contact plugs 340 may thus be electrically connected to at least one of the conductive layers 310B by omitting an insulating spacer 330.

The contact plugs 340 may extend downwardly and orthogonally through the layers 310A, 310B of the gate structure 310 and through the interlayer insulating layer IL. Each of the contact plugs 340 may include a first tapered part 340P1 and may include a second, substantially cylindrical part 340P2. A contact plug's tapered first part 340P1 may be electrically connected to an n-th conductive layer 310Bn with its second, cylindrical part 340P2 being electrically insulated from conductive layers that are beneath the n-th conductive layer 310B1 by insulating spacers 330.

In the contact plugs 340, the tapered first part 340P1 may have a first diameter or "width" S1. The cylindrical second part 340P2 may have a lesser second diameter or "width" S2. For example, the first width S1 may be greater than the second width S2. In this case, the first width S1 may be a top width or bottom width of the first part 340P1 or may be a middle width between the top and the bottom.

As best seen in FIG. 3B, the first part 340P1 of each of the contact plugs 340 may be tapered. The tapered portion of the contact plugs 340 may thus have a sidewall that is inclined "into" or toward the uppermost conductive layers 310B. For example, the first part 340P1 of the contact plug 340-1 may include a sidewall that is inclined "into" or toward the uppermost conductive layer 310B-4 compared to the cylindrical and therefore vertical second part 340P2. In a process of manufacturing the semiconductor device, different lengths of different contact plugs 340 may be formed to have the tapered cross section shape. Accordingly, electrical connectivity with the uppermost conductive layer 310B-4 can be improved because locations at which the first part 340P1 and the uppermost conductive layer 310B will be formed can neighbor each other.

The insulating spacers 330 may be disposed between the conductive layers 310B and the contact plugs 340 and may surround the sidewalls of the contact plugs 340. The insulating spacers 330 may also protrude into the sidewall of the contact plugs 340. For example, the insulating spacers 330 may protrude into the sidewall of the second parts 340P2 of the contact plugs 340.

According to the aforementioned structure, the contact plugs 340 may each include a tapered first part 340P1 electrically connected to the conductive layer 310B. In this case, the tapered first part 340P1 may include a sidewall that is inclined toward a conductive layer 310B that the conductive layer 310B is to be electrically connected to. For example, a contact plug 340 may include a tapered first part 340P1 that is connected to an n-th conductive layer 310Bn, with the tapered sidewall inclined toward the n-th conductive layer 310Bn. Accordingly, electrical connectivity between the contact plug 340 with a tapered portion and an n-th conductive layer 310Bn can be improved.

Furthermore, the contact plug 340 may include a cylindrical second part 340P2 having a length that extends downwardly and through, and which may be electrically isolated from lower, remaining conductive layers 310B by insulating spacers 330 may be disposed between the second part 340P2 and the lower, remaining conductive layers 310B. For example, the insulating spacers 330 may be disposed between the second part 340P2 of the contact plug 340-1 and the first conductive layer 310B-1 t Accordingly, the contact plug 340-1 and the lower conductive layers 310B-1 to 310Bn-3 can be electrically isolated from each other.

Figure 4A:
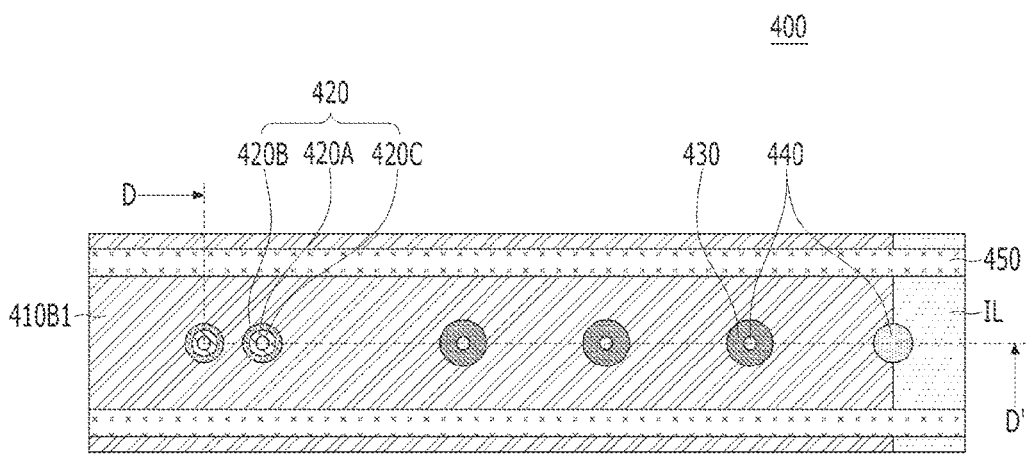
FIGS. 4A and 4B respectively are horizontal and vertical cross-sectional diagrams of a semiconductor device according to an embodiment of the present disclosure.
Figure 4B:
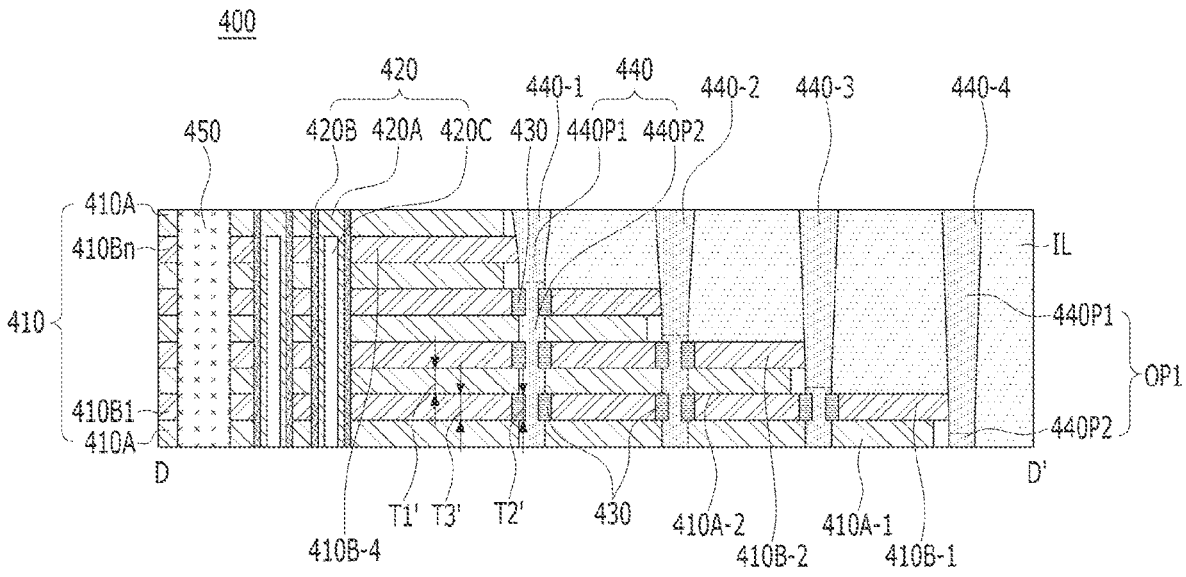

FIGS. 4A and 4B respectively are horizontal and vertical cross-sectional diagrams of a semiconductor device according to an embodiment of the present disclosure. FIG. 4B may be a vertical cross-sectional view taken along section line D-D' in FIG. 4A. Duplicative descriptions are omitted in the interest of brevity.

Referring to FIGS. 4A and 4B, the semiconductor device 400 may include a gate structure 410, channel structures 420, insulating spacers 430, and contact plugs 440. The semiconductor device may further include a slit structure 450 and an interlayer insulating layer IL.

As with the other embodiments described above, the gate structure 410 may include interleaved, extended-length insulating layers 410A and conductive layers 410B.

Insulating spacers 430 may be disposed between conductive layers 410B and contact plugs 440 to electrically isolate a conductive layer 410B from a contact plug 440.

The thicknesses, T3, of the conductive layers 410B, the thickness T1 of the insulating layers 410A and the thickness T2 of the insulating spacers 430 may be substantially the same.

Figure 5:
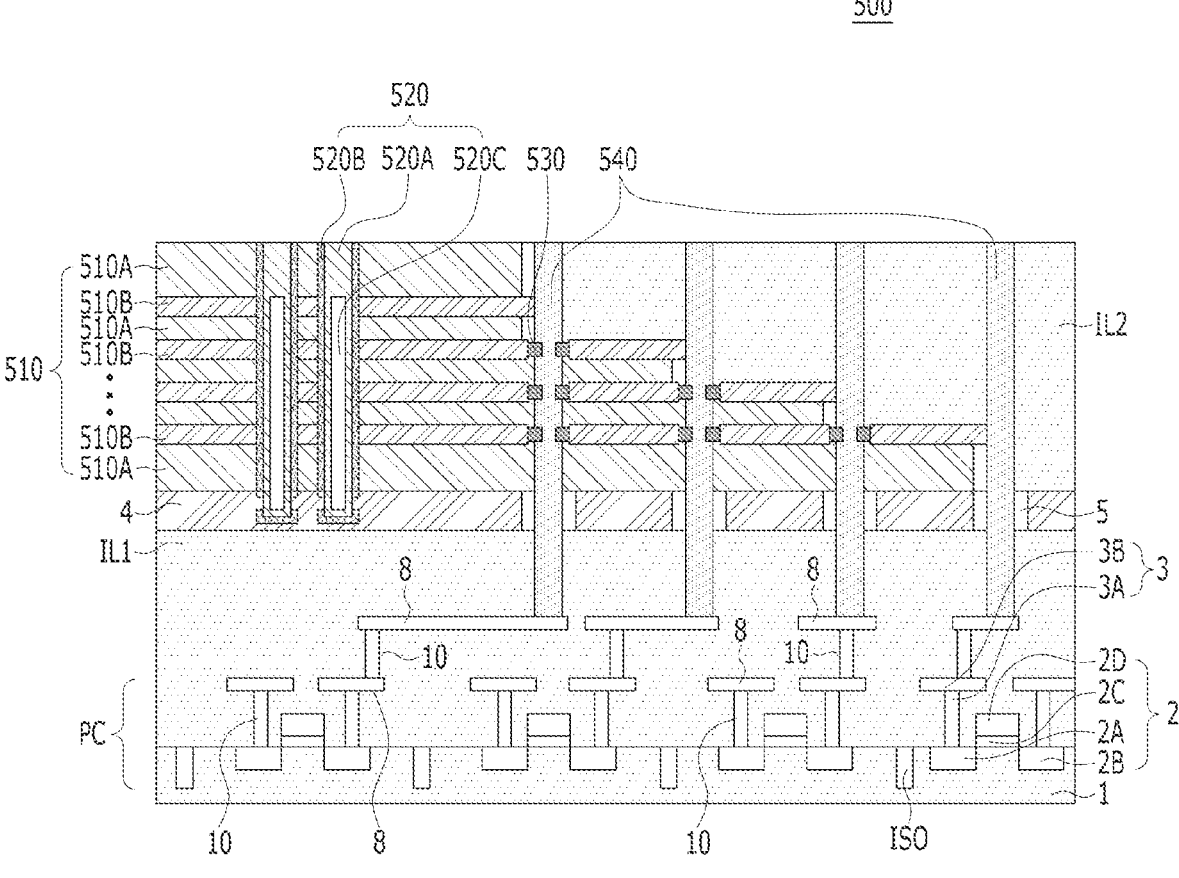
FIG. 5 is a vertical cross-sectional diagram for describing a semiconductor device according to an embodiment of the present disclosure.

FIG. 5 is a vertical cross-sectional diagram for describing a semiconductor device 500 according to an embodiment of the present disclosure. Hereinafter, redundant descriptions are omitted in the interest of brevity.

Referring to FIG. 5, the semiconductor device 500 may include a gate structure 510, channel structures 520, insulating spacers 530, and contact plugs 540. The semiconductor device 500 may further include a substrate 1, a source structure 4, spacers 5, a peripheral circuit PC, an interconnection structure 3, an isolation layer ISO, and interlayer insulating layers IL1 and IL2.

The peripheral circuit PC may be disposed under a memory cell array of the semiconductor device 500. The memory cell array may be embodied as any one of the memory device embodiments 100, 200, 300 and 400, which are depicted in FIGS. 1A and 1B, FIGS. 2A and 2B, FIGS. 3A and 3B and FIGS. 4A and 4B, respectively. The peripheral circuit PC may include a transistor 2, a capacitor, or a register. The cell array and the peripheral circuit PC may be connected to each other. For example, the contact plugs 540 of the cell array may be electrically connected to the peripheral circuit PC using conventional horizontally-oriented integrated circuit traces 8 and vertically-oriented conductive vias 10.

The channel structures 520 may each include a channel layer 520A, a memory layer 520B, and an insulating core 520C. The channel structures 520 may extend through gate structure 510, and may be connected to the source structure 4. For example, the channel layer 520A may be directly connected to the source structure 4 or may be connected to the source structure 4 through an epitaxial pattern that has been formed by using an epitaxial method. In this case, the source structure 4 may be disposed over the substrate 1.

Contact plugs 540 may extend through the gate structure 510, through the source structure 4, and may be electrically connected to the peripheral circuit PC and to the transistor 2. Tube-shaped spacers 5 may be disposed between contact plugs 540 and the source structure 4.

The peripheral circuit PC may be disposed on the substrate 1 and an isolation layer ISO may be disposed within the substrate 1. An "active area" may be defined by the isolation layer ISO. The peripheral circuit PC may include the transistor 2, the capacitor, or the register. For example, the transistor 2 may include a first junction 2A, a second junction 2B, a gate insulating layer 2C, or a gate electrode 2D. The gate insulating layer 2C may be disposed between the gate electrode 2D and the substrate 1. The gate insulating layer 2C and the isolation layer ISO may each include an insulating material, such as oxide or nitride.

The interconnection structure 3 may include electrically conductive contact vias 3A or wires 3B.

The interlayer insulating layer IL1 may be disposed on the substrate 1. The interconnection structure 3 may be disposed within the interlayer insulating layer IL1. The interconnection structure 3 may be electrically connected to the peripheral circuit PC. Each of the contact vias 3A may connect the junction 2A or 2B of the transistor 2 and the wire 3B or may mutually connect the wires 3B. Furthermore, each of the contact vias 3A may connect the gate electrode 2D and the wire 3B. The contact vias 3A or the wires 3B may each include a conductive material, such as aluminum, copper, or tungsten.

Figure 6:
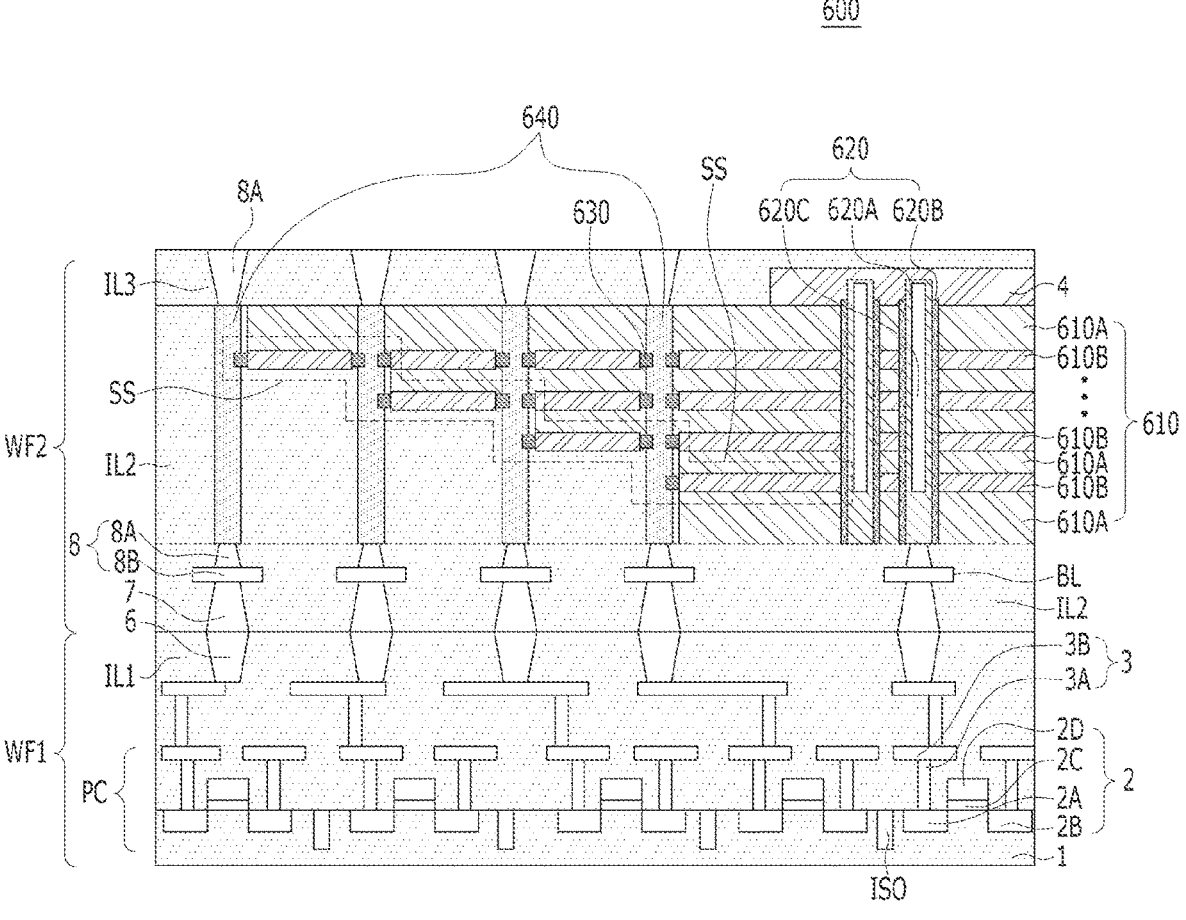
FIG. 6 is a vertical cross-sectional diagram for describing a semiconductor device according to an embodiment of the present disclosure.

FIG. 6 is a vertical cross-sectional diagram for describing a semiconductor device 600 according to an embodiment of the present disclosure. Redundant descriptions are omitted in the interest of brevity.

Referring to FIG. 6, the semiconductor device 600 may include a first wafer WF1 and a second wafer WF2, which are stacked. The second wafer WF2, which may be a memory device and is shown on top of the first wafer WF1, may include a gate structure 610, channel structures 620, insulating spacers 630, contact plugs 640, a source structure 4, an interconnection structure 8, a second bonding pad 7, a bit line BL, and interlayer insulating layers IL2 and IL3.

The first wafer WF1 may include a peripheral circuit PC, a substrate 1, a transistor 2, an interconnection structure 3, a first bonding pad 6, and an interlayer insulating layer IL1. First bonding pads 6 may be disposed within the interlayer insulating layer IL1 and may each be electrically connected to the transistor 2 through the interconnection structure 3.

The second wafer WF2, which may be a memory device, may include a memory cell array. For example, the second wafer WF2 may include the gate structure 610, the channel structures 620, the insulating spacers 630, the contact plugs 640, the source structure 4, the interconnection structure 8, the second bonding pad 7, the bit line BL, and interlayer insulating layers IL2 and IL3.

The gate structure 610 may include a reversed stair structure, SS. Second bonding pads 7 may be disposed under the gate structure 610 and within the second interlayer insulating layer IL2. The second bonding pads 7 may each be electrically connected to a contact plug 640 through the interconnection structure 8. An interconnection structures 8 may include a contact via 8A or a wire 8B.

The source structure 4 may be disposed on the gate structure 610 and be connected to channel structures 620. The source structure 4 may also be disposed within the third interlayer insulating layer IL3. Contact vias 8A connected to the contact plugs 640 may be disposed within the third interlayer insulating layer IL3, which may be disposed over the gate structure 610. A bit line BL may be disposed under the gate structure 610 and be connected to at least one of the channel structures 620. The bit line BL may also be connected to at least one of the second bonding pads 7.

The first wafer WF1 and the second wafer WF2 may be bonded together. The first bonding pads 6 and the second bonding pads 7 may thus be bonded together. Contact plugs 640 may thus be each electrically connected to the transistor 2 through bonding pads 6 and 7 and the interconnection structures 3 and 8. Furthermore, the channel structures 620 may each be electrically connected to the transistor 2 through the bit line BL, the bonding pads 6 and 7, and the interconnection structures 3 and 8.

As used herein, "top" and "bottom" should be construed as being relative and are used as such for convenience and brevity purposes. For example, the first wafer WF1 may be disposed on top of the second wafer WF2. Accordingly, if the first and second wafers have top and bottom surfaces, which are substantially parallel, the top of the second wafer WF2 and the top of the first wafer WF1 may be bonded to each other only if the first wafer WF1 has been rotated.

According to the aforementioned structure, the peripheral circuit PC may be disposed in the first wafer WF1. The cell array may be disposed in the second wafer WF2. The integration density of the two wafers mounted to each other can thus be a significant increase over the density of separating the two wafers from each other.

Furthermore, the first wafer WF1 and the second wafer WF2 may be bonded. Accordingly, the peripheral circuit PC of the first wafer WF1 and the contact plugs 640 and channel structures 620 of the second wafer WF2 may be electrically connected.

FIGS. 7A, 7B, 8A, 8B, 9A, 9B, 10A, 10B, 11A, 11B, 12A, 12B, 13A, and 13B are diagrams for describing a method of manufacturing a semiconductor device according to an embodiment of the present disclosure. FIGS. 7A, 8A, 9A, 10A, 11A, 12A, and 13A may be plan views of the semiconductor device. FIGS. 7B, 8B, 9B, 10B, 11B, 12B, and 13B may be cross-sectional views of FIGS. 7A, 8A, 9A, 10A, 11A, 12A, and 13A, respectively. Hereinafter, redundant descriptions are omitted in the interest of brevity.

Figure 7A:
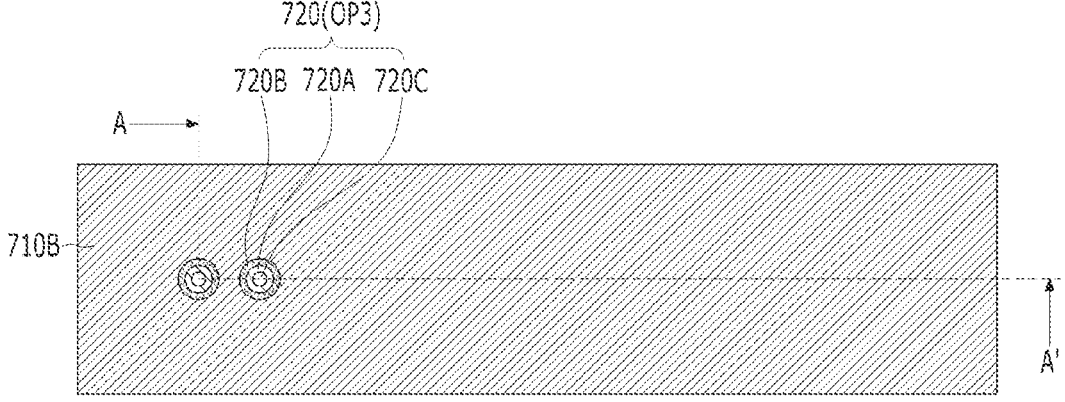
FIGS. 7A, 7B, 8A, 8B, 9A, 9B, 10A, 10B, 11A, 11B, 12A, 12B, 13A, and 13B are diagrams for describing a method of manufacturing a semiconductor device according to an embodiment of the present disclosure.
Figure 7B:
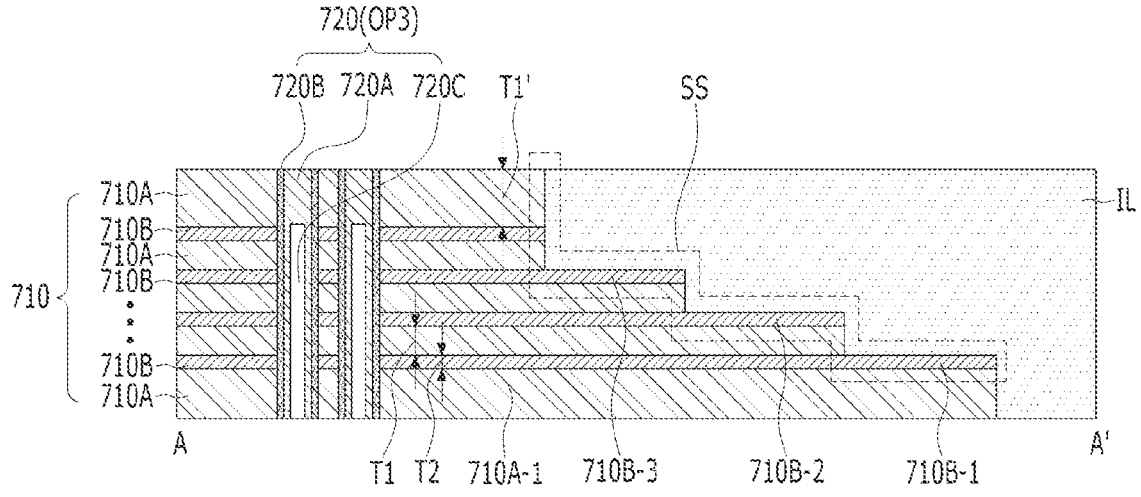

Referring to FIGS. 7A and 7B, a stack 710 may be formed by iteratively forming extended-length second material layers 710B on top of extended-length first material layers 710A and concluding the iterative layer-forming processes with a thicker, top or uppermost first material layer 710A. The first material layers 710A, which may be a metal oxide, may have a first thickness T1, except for the uppermost first material layer 710A, which as shown, may have a greater thickness, T1'. The second material layers 710B, which may be electrically conductive, may each have a second thickness T2. The first thickness T1 and the second thickness T2 may be substantially the same or may be different from each other. For example, the second thickness T2 may be smaller than the first thickness T1.

A stair structure. SS, may be formed within the stack 710, which, exposes an upper surface of at least one of the second material layers 710B-1 through 710B-3, to the material forming the interlayer IL. In this case, the second material layer 710B that is exposed by the stair structure SS, 710B, may be defined as an uppermost second material layer 710B. An interlayer insulating layer IL may be formed on the stack 710.

Channel structures 720 may be formed within the stack 710. Third openings OP3 that extend through the stack 710 may be formed. Next, the channel structures 720 may be formed within the third openings OP3, respectively. The channel structures 720 may be formed before the stair structure, SS, is formed within the stack 710. The channel structures 720 may each include a channel layer 720A, a memory layer 720B that surrounds the channel layer 720A, or an insulating core 720C within the channel layer 720A.

For reference, although not illustrated in the drawings, a peripheral circuit may be formed before the stack 710 is formed. The peripheral circuit may include a transistor, a capacitor, or a register. The peripheral circuit may be electrically connected to contact plugs (not illustrated) to be formed in a subsequent process.

Figure 8A:
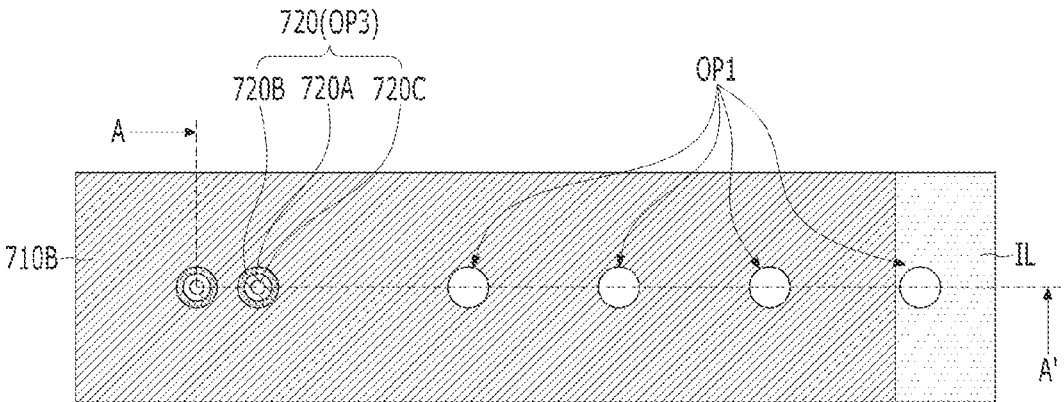
Figure 8B:
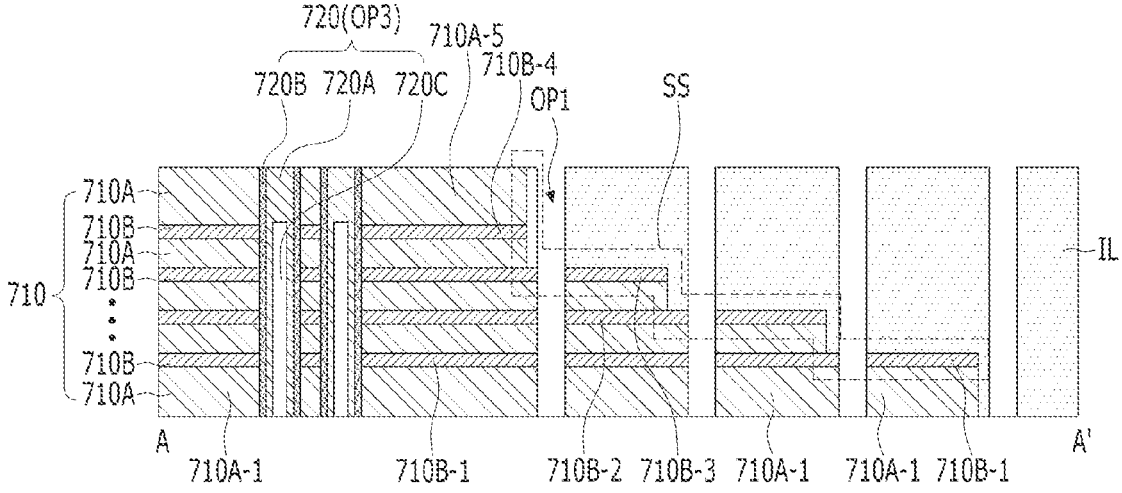

Referring to FIGS. 8A and 8B, a first opening OP1 that extends into the stack 710 may be formed, which is at the distal end of the uppermost first insulating material layer 710A-5 and the uppermost second conductive material layer 710B-4. The first opening OP1, however, is located away from the distal end of the next-lower second material layer 710B-3, "exposed" by the stair structure, SS, and which extends into the interlayer insulating layer IL. The first opening OP1 may extend through the remaining second material layers 710B-2 and 710B-1.

For reference, when the first openings OP1 are formed, the third openings OP3 may be formed. Thereafter, the channel structures 720 may be formed within the third openings OP3, respectively. In this case, the first openings OP1 may maintain an opened state.

Figure 9A:
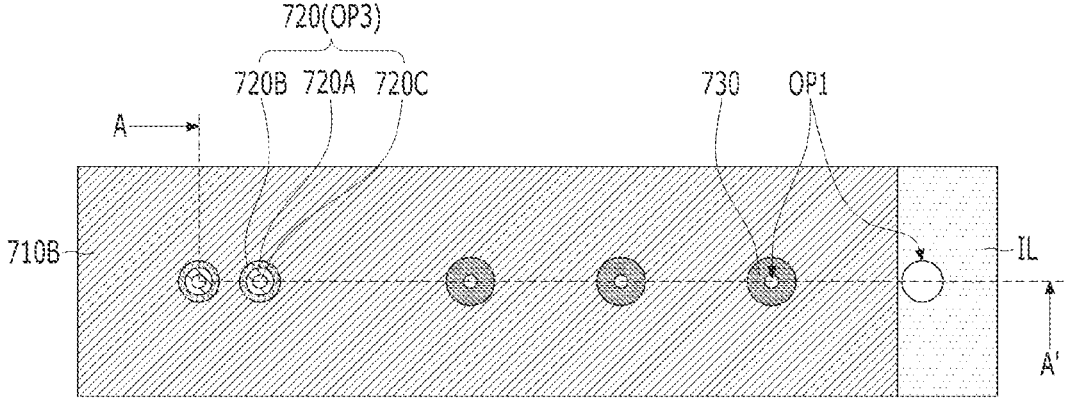
Figure 9B:
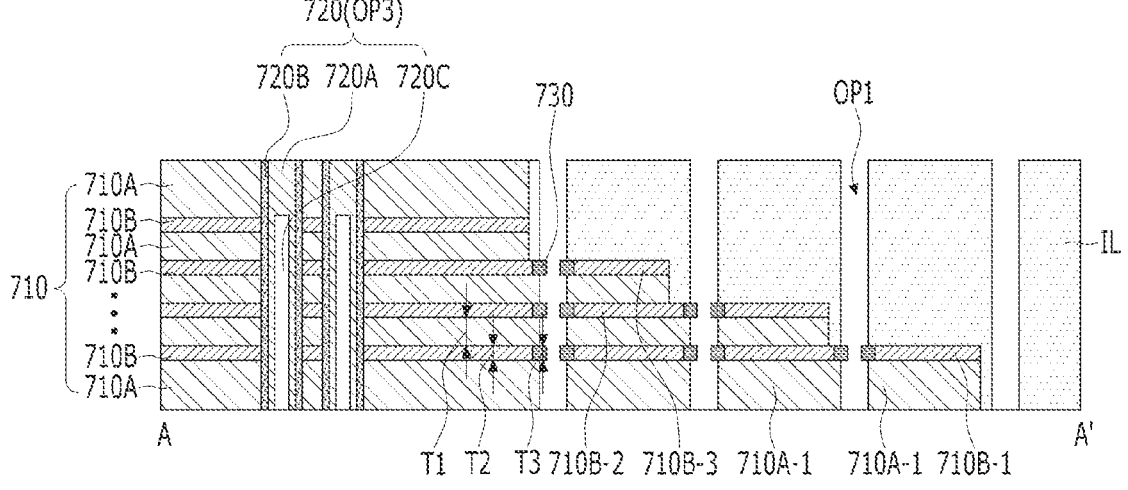

Referring to 9A and FIG. 9B, insulating spacers 730 may be formed. For example, the insulating spacers 730 may be formed by oxidizing the second material layers 710B that are exposed through the first openings OP1. In this case, the insulating spacers 730 may protrude into the first openings OP1.

The insulating spacers 730 may be formed by oxidizing the remaining second material layers 710B. In a subsequent process, a uppermost second material layer 710B may need to be connected to a contact plug (not illustrated) by being substituted with a third material layer (not illustrated). Accordingly, although the remaining second material layers 710B may be substituted with the third material layers (not illustrated), the remaining second material layers 710B can be electrically isolated from contact plugs (not illustrated) because insulating spacers 730 may be formed by oxidizing the remaining second material layers 710B.

The insulating spacers 730 may have a third thickness T3, which may be substantially the same as or may be different from the first thickness T1 or the second thickness T2. For example, the third thickness T3 may be smaller than the first thickness T1. The third thickness T3 may be substantially the same as the second thickness T2.

Figure 10A:
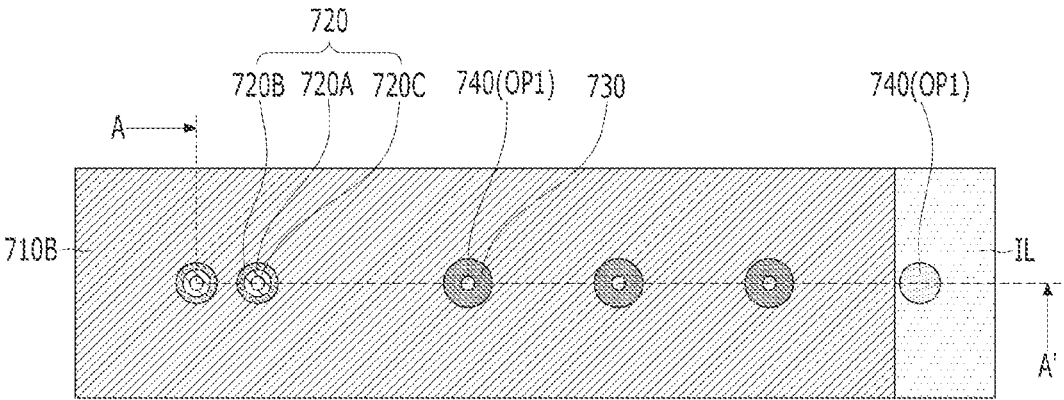
Figure 10B:
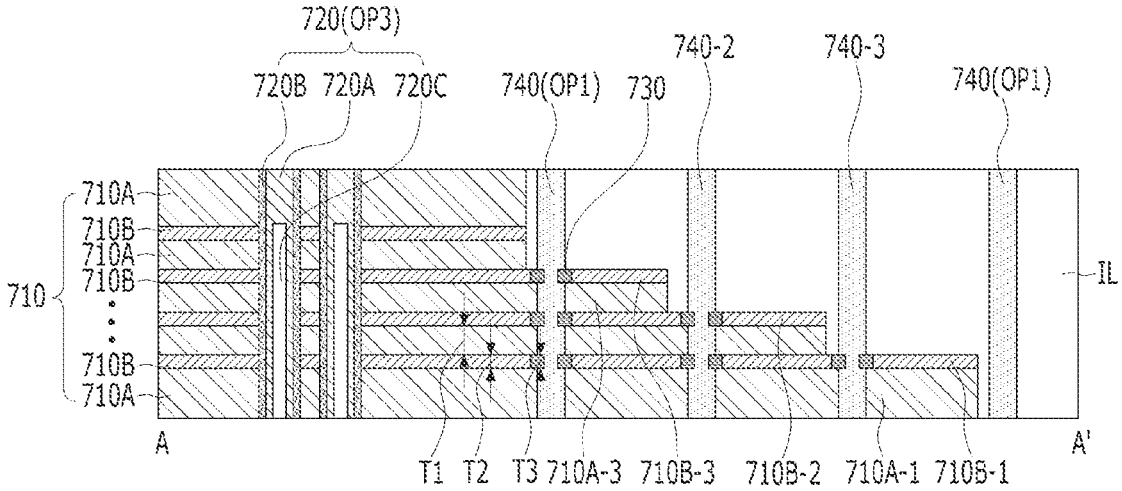

Referring to FIGS. 10A and 10B, contact plugs 740 may be formed within the first openings OP1, respectively. The contact plugs 740 may each be formed to be spaced apart from the end of the uppermost second material layer 710B. The contact plugs 740 may each have an unevenly-shaped sidewall o due to the insulating spacers 730. The insulating spacers 730 may protrude into the contact plugs 740.

The insulating spacers 730 may be disposed between the contact plugs 740 and the remaining second material layers 710B. When second material layers 710B are substituted with third material layers (not illustrated) in a subsequent process, the third material layers (not illustrated) may be electrically isolated from contact plugs insulated by the insulating spacers 730.

Figure 11A:
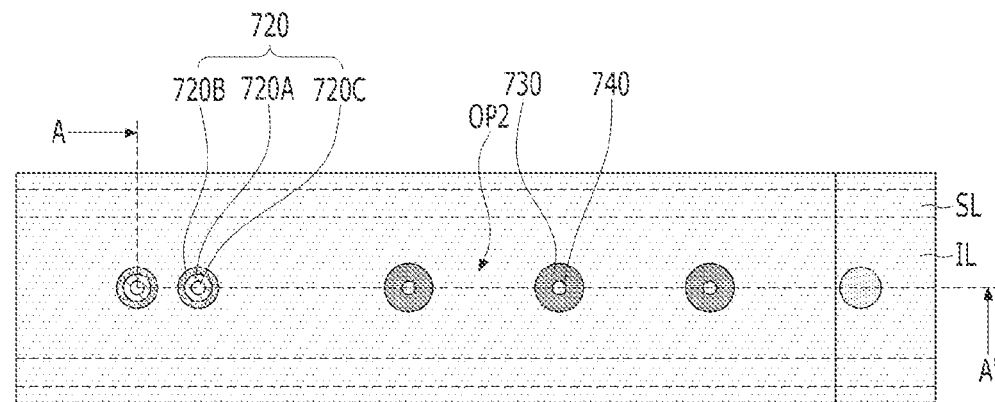
Figure 11B:
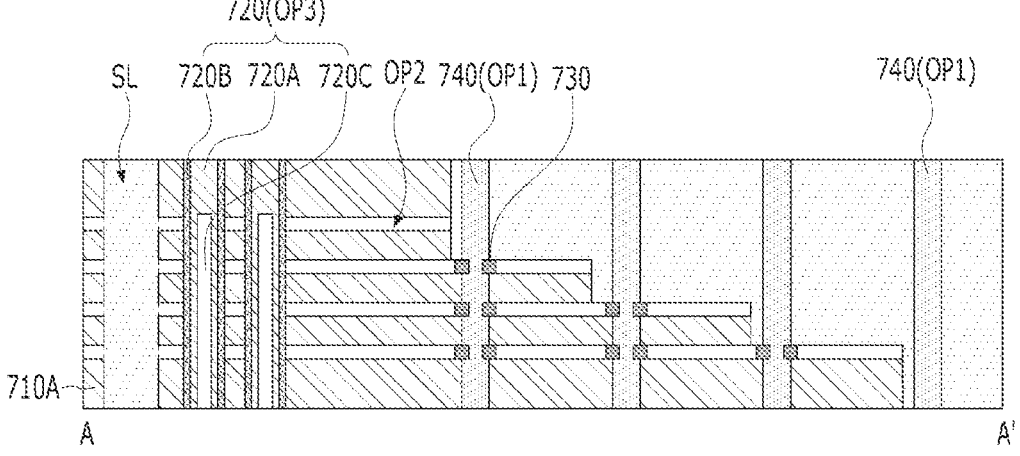

Referring to FIGS. 11A and 11B, a slit SL may be formed, which may extend through the stack 710. The slit SL may be formed by being spaced apart from the channel structures 720 and the contact plugs 740.

Next, second openings OP2 may be formed. For example, the horizontal second openings OP2 may be formed by removing the second material layers 710B. through the slit SL. In this case, the horizontal second opening OP2 at a location from which the uppermost second material layer 710B has been removed, may be defined as the uppermost second opening OP2. The horizontal second openings OP2 at locations from which the remaining second material layers 710B have been removed may be defined as the remaining second openings OP2.

Figure 12A:
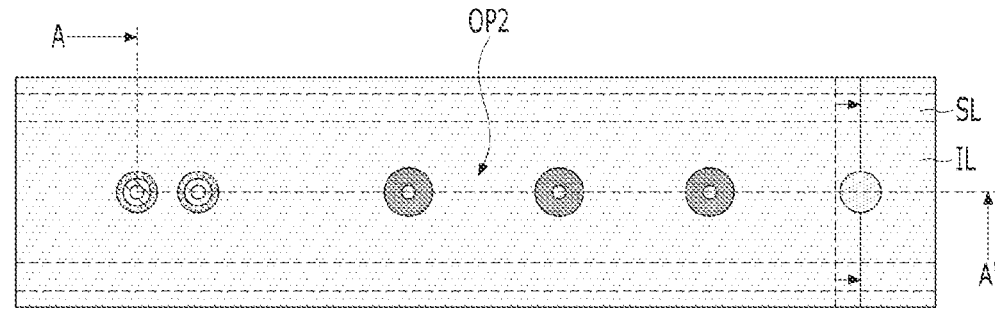
Figure 12B:
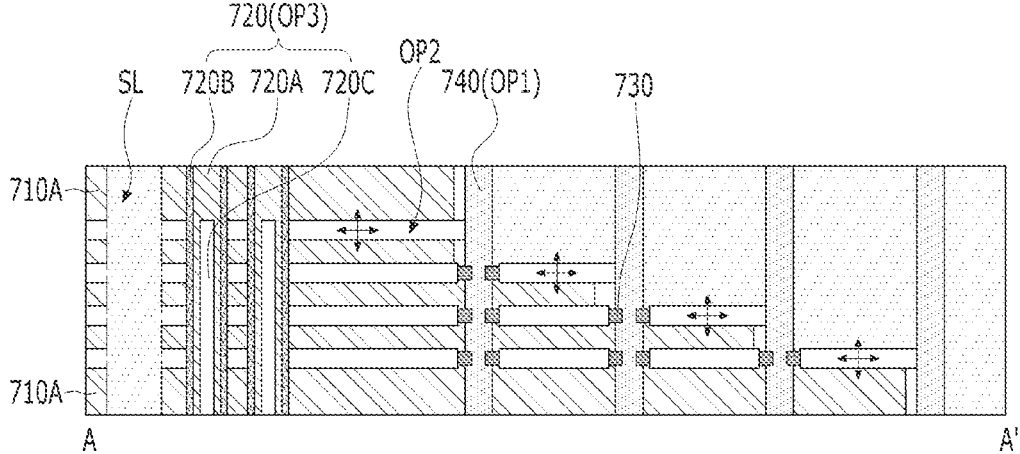

Referring to FIGS. 12A and 12B, the contact plugs 740 may be exposed by extending the horizontal second openings OP2. For example, the second, openings OP2 may be extended horizontally (as shown) by selectively etching the first material layers 710A that have been exposed by the second openings OP2.

At least a part of the sidewall of the contact plug 740 may be exposed by extending the uppermost second opening OP2. For example, a part of the sidewall of the contact plug 740 may be exposed by extending the uppermost second opening OP2. As another example, the entire sidewall of the contact plug 740 may be exposed by extending the uppermost second opening OP2.

The contact plug 740 might not be exposed at a level corresponding to the remaining second openings OP2 except the uppermost second opening OP2 by the insulating spacers 730. For example, in the process of selectively etching the first material layers 710A, a part of the insulating spacers 730 may also be etched, but the contact plugs 740 might not be exposed by the insulating spacers 730 that each have been formed to have a sufficient thickness and a sufficient width by oxidizing the second material layers 710B.

Figure 13A:
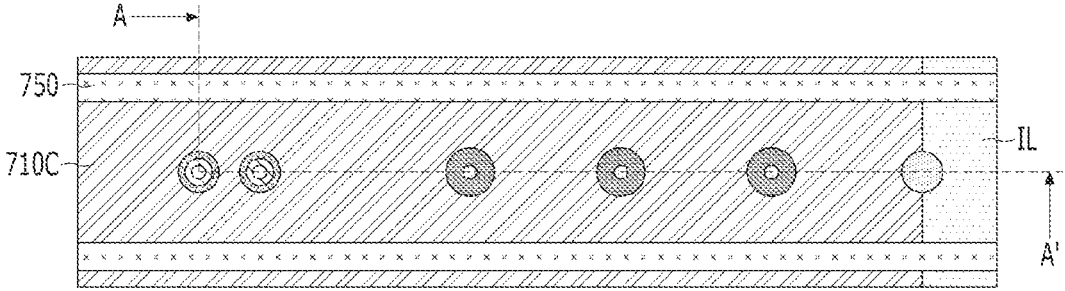
Figure 13B:
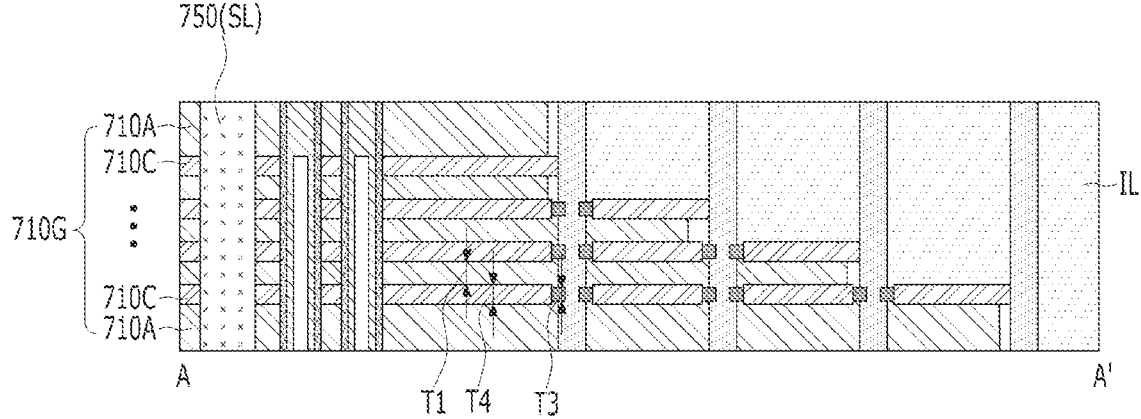

Referring to FIGS. 13A and 13B, third material layers 710C may be formed through the slit SL. For example, the third material layers 710C may be formed within the second openings OP2, respectively. Accordingly, a gate structure 710G including the first material layers 710A and the third material layers 710C that are alternately stacked may be defined. The third material layer 710C that is formed within the uppermost horizontal second opening OP2, among the third material layers 710C, may be defined as the uppermost third material layer 710C. The third material layers 710C that are formed within the remaining horizontal second openings OP2, among the third material layers 710C, may be defined as the remaining third material layers 710C. The remaining third material layers 710C except the uppermost third material layer 710C may be insulated from the contact plug 740 by the insulating spacers 730.

The third material layers 710C may each have a fourth thickness T4. The fourth thickness T4 may be substantially the same as or may be different from the first thickness T1 or the third thickness T3. For example, the fourth thickness T4 may be greater than the third thickness T3. The fourth thickness T3 may be substantially the same as the first thickness T1. The third material layers 710C may each include a conductive material, such as tungsten or molybdenum. Next, a slit structure 750 may be formed within the slit SL. The slit structure 750 may include a support or a source contact structure.

For reference, although not illustrated in the drawings, a peripheral circuit may be formed in a wafer that is separated from a cell array wafer including the channel structures 720 or the contact plugs 740. The cell array wafer and the separate wafer may be bonded. In this case, the contact plugs 740 may be electrically connected to the peripheral circuit in the separate wafer.

According to the aforementioned process, before the contact plug 740 is formed, the insulating spacers 730 may be formed by oxidizing the remaining second material layers 710B except the uppermost second material layer 710B. Accordingly, when the contact plug 740 is exposed by extending the horizontal second openings OP2, the contact plug 740 at levels corresponding to the remaining second openings OP2 might not be exposed.

Figure 14A:
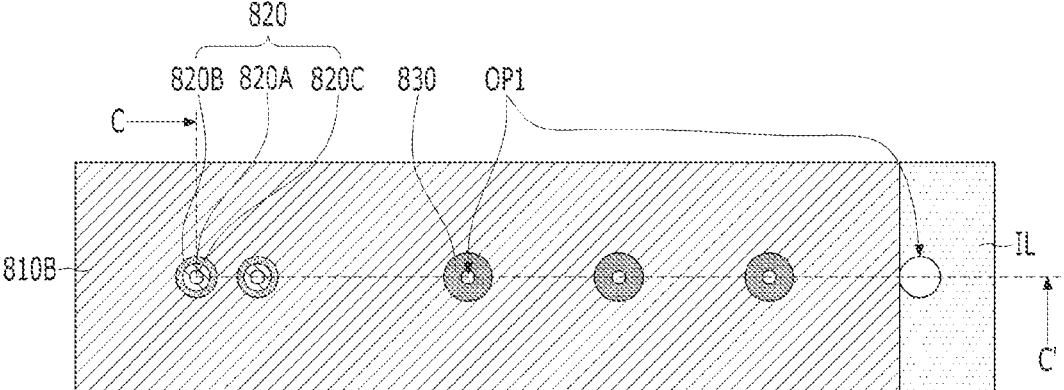
FIGS. 14A, 14B, 15A, 15B, 16A, and 16B are diagrams for describing a method of manufacturing a semiconductor device according to an embodiment of the present disclosure.
Figure 14B:
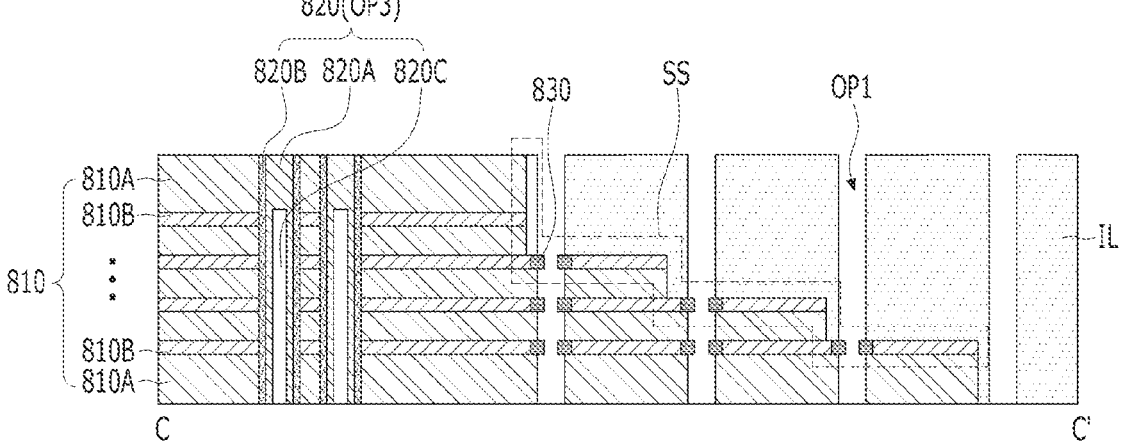
Figure 15A:
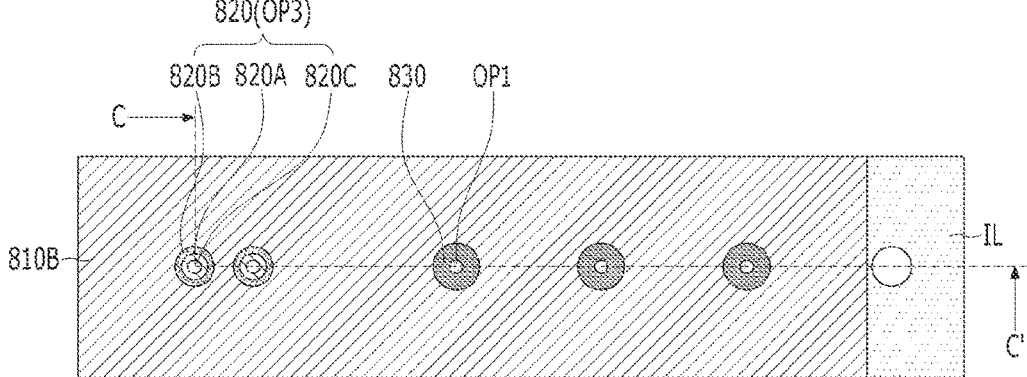
Figure 15B:
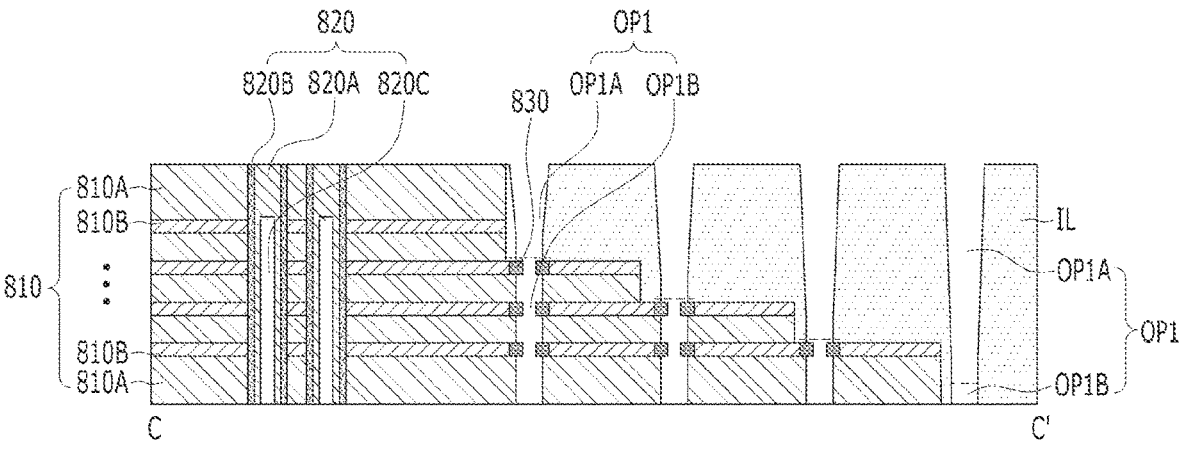
Figure 16A:
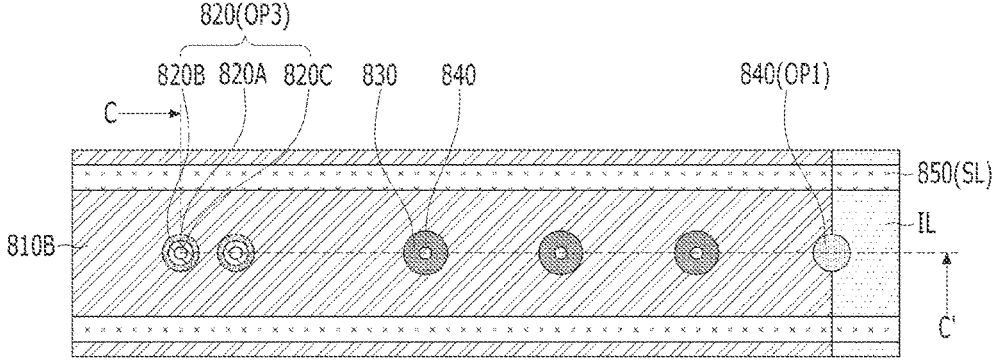
Figure 16B:
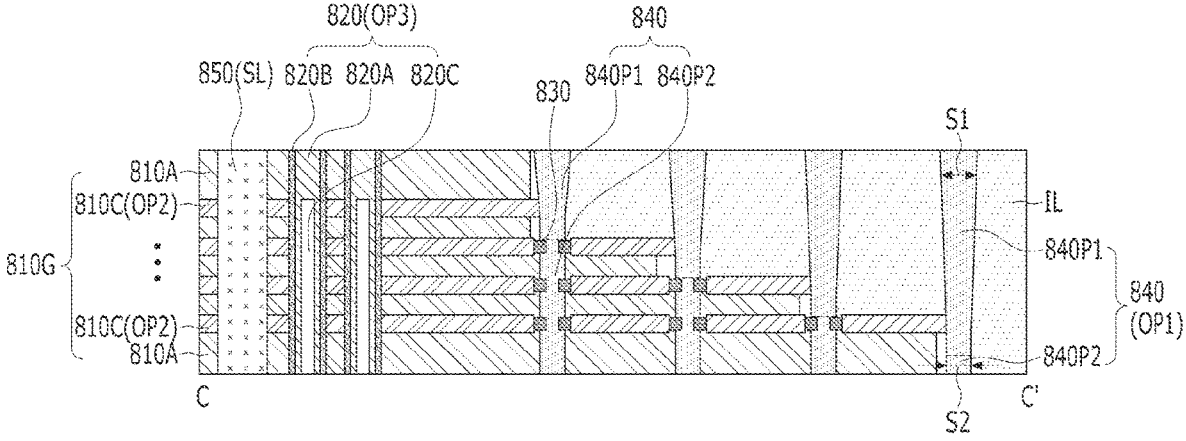

FIGS. 14A, 14B, 15A, 15B, 16A, and 16B are horizontal and vertical cross-sectional diagrams for describing a method of manufacturing a semiconductor device according to embodiments of the present disclosure. FIGS. 14A, 15A, and 16A may be horizontal cross sections, also known as plan views, of the semiconductor device. FIGS. 14B, 15B, and 16B are vertical cross-sectional views of FIGS. 14A, 15A, and 16A, respectively. Redundant descriptions are omitted in the interest of brevity.

Referring to FIGS. 14A and 14B, a stack 810 including interleaved, (also referred to herein as alternately-stacked) extended-length first material layers 810A and second material layers 810B may be formed. The stack 810 may include a stair structure, SS, which "exposes" at least one of the second material layers 810B. An interlayer insulating layer IL may be formed on the stack 810. including the interleaved extended-length layers.

First openings OP1 may be formed. Insulating spacers 830 may be formed by oxidizing the second material layers 810B that are exposed through the first openings OP1. For example, the insulating spacers 830 may be formed by oxidizing the remaining second material layers 810B except the uppermost second material layer 810B.

Channel structures 820 that extend through the stack 810 may be formed. The channel structures 820 may each include a channel layer 820A, a memory layer 820B that surrounds the channel layer 820A, or an insulating core 820C within the channel layer 820A.

Referring to FIGS. 15A and 15B, the first openings OP1 may be extended. For example, the first openings OP1 may each be extended to neighbor the uppermost second material layer 810B. The first openings OP1 may each include a first part OP1A and a second part OP1B. The first part OP1A may be spaced apart from the end of the uppermost second material layer 810B. The second part OP1B may extend into the stack 810. The first openings OP1 may each be extended by selectively etching the sidewall of the first part OP1A. Accordingly, the first part OP1A may have a cross section having a taper shape, and may be extended to neighbor the uppermost second material layer 810B. In this case, the insulating spacers 830 can prevent the second part OP1B from being etched or can minimize the etching of the second part OP1B.

Referring to FIGS. 16A and 16B, the contact plugs 840 may be formed within the first openings OP1, respectively. The contact plug 840 may include a part corresponding to the first part OP1A and a part corresponding to the second part OP1B. The contact plugs 840 may each have a first width S1 of the part corresponding to the first part OP1A and a second width S2 of the part corresponding to the second part OP1B. The first width S1 may be substantially the same as or different from the second width S2. For example, the first width S1 may be greater than the second width S2. In this case, the first width S1 may be a top width or bottom width of the contact plug 840 or a middle width between the top and the bottom.

The second material layers 810B may be substituted with third material layers 810C. For example, through the slit SL, the second material layers 810B may be removed and the third material layers 810C may be formed. Accordingly, a gate structure 810G including the first material layers 810A and the third material layers 810C that are alternately stacked may be defined. Before the third material layers 810C are formed, the contact plugs 840 may be exposed by selectively etching the first material layers 810A. The remaining third material layers 810C except the uppermost third material layer 810C and the contact plug 840 may be insulated by the insulating spacers 830. A slit structure 850 may be formed within the slit SL.

According to the aforementioned process, if the first openings OP1 are extended, the first material layers 810A can be etched relatively less when the contact plug 840 corresponding to the first part OP1A is exposed by removing the uppermost second material layer 810B and etching the first material layers 810A in a subsequent process. Accordingly, although the insulating spacers 830 are etched by some thickness in a process of removing the remaining second material layers 810B and etching the first material layers 810A, the contact plug 840 corresponding to the second part OP1B might not be exposed.

Figure 17A:
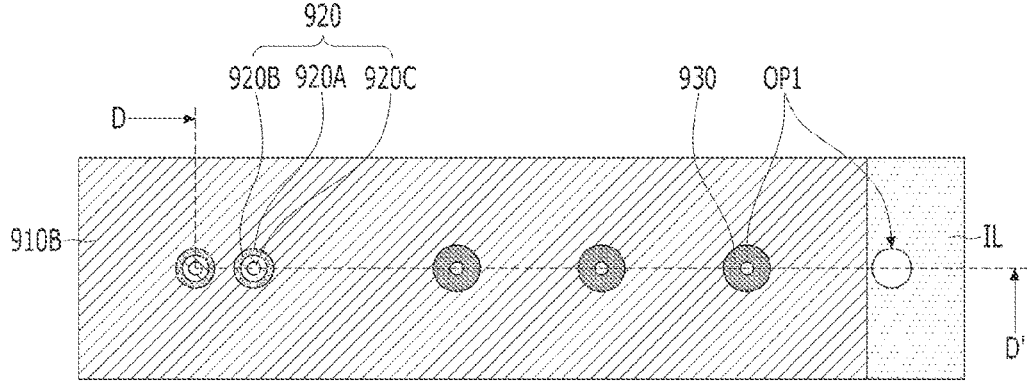
FIGS. 17A, 17B, 18A, 18B, 19A, and 19B are diagrams for describing a method of manufacturing a semiconductor device according to an embodiment of the present disclosure.
Figure 17B:
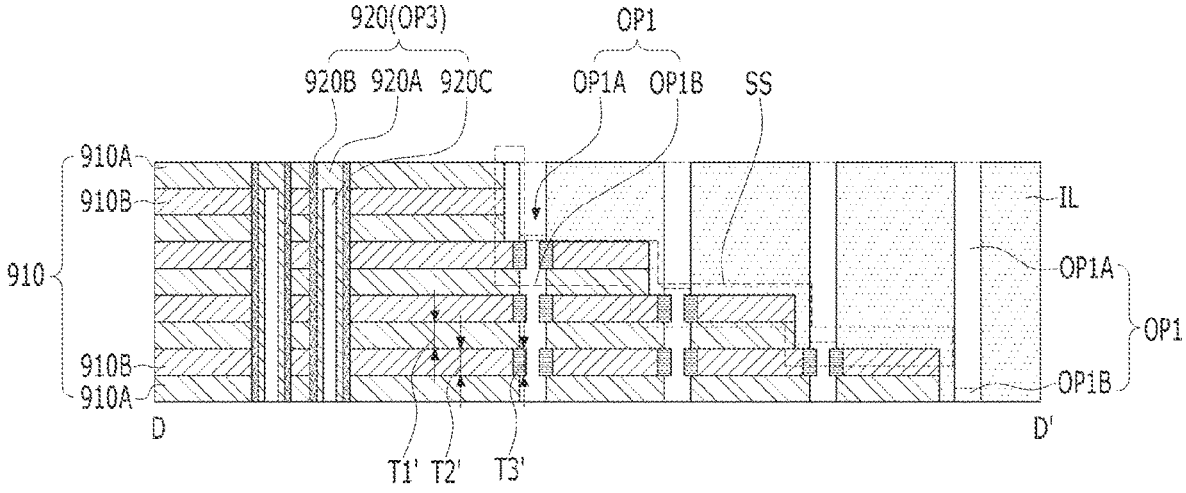
Figure 18A:
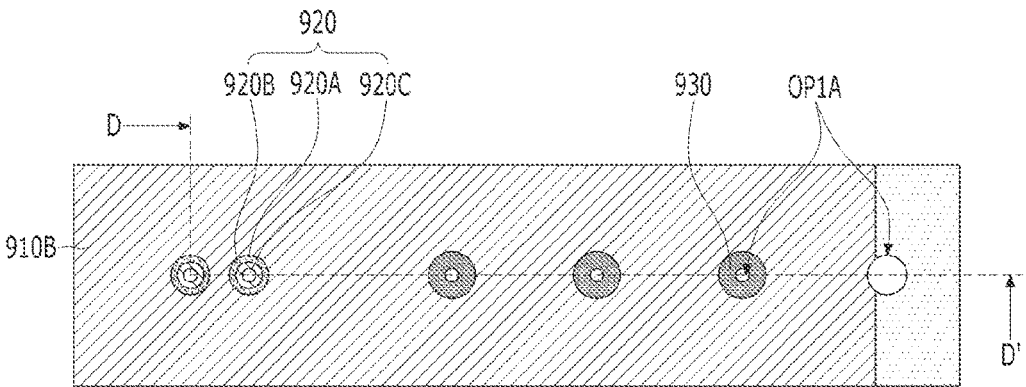
Figure 18B:
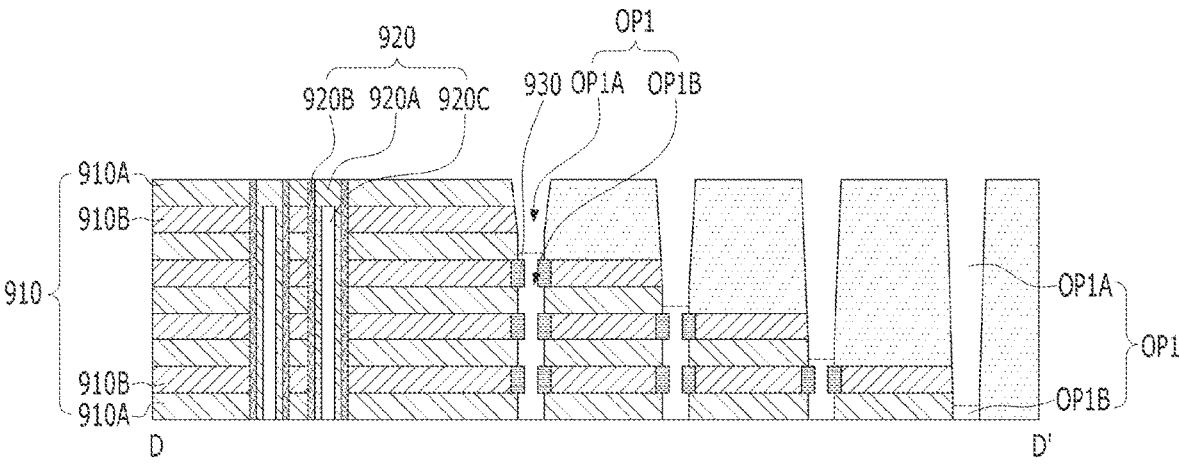
Figure 19A:
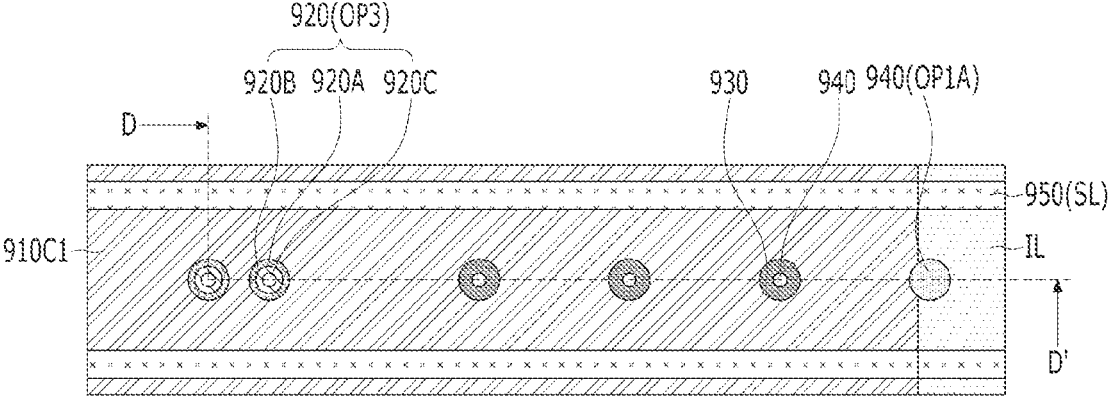
Figure 19B:
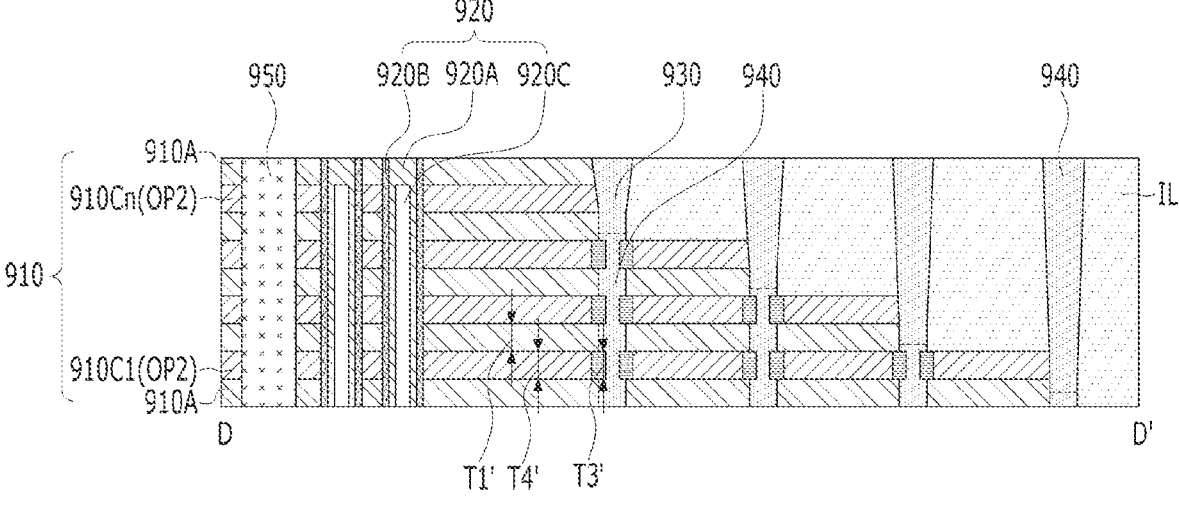

FIGS. 17A, 17B, 18A, 18B, 19A, and 19B are diagrams for describing a method of manufacturing a semiconductor device according to an embodiment of the present disclosure. FIGS. 17A, 18A, and 19A may be plan views of the semiconductor device. FIGS. 17B, 18B, and 19B may be cross-sectional views of FIGS. 17A, 18A, and 19A, respectively. Hereinafter, a description of contents redundant with the aforementioned contents is omitted.

Referring to FIGS. 17A and 17B, a stack 910 including first material layers 910A and second material layers 910B that are alternately stacked, i.e., interleaved, may be formed. The first material layers 910A may each have a first thickness T1'. The second material layers 910B may each have a second thickness T2'. The stack 910 may include a stair structure, SS, that exposes at least one of the second material layers 910B. An interlayer insulating layer IL may be formed on the stack 910.

First openings OP1 may be formed. Each of the first openings OP1 may include a first part OP1A that is spaced apart from the end of the uppermost second material layer 910B and a second part OP1B that extends into the stack 910. Insulating spacers 930 may be formed by oxidizing the second material layers 910B that are exposed through the first openings OP1. For example, the insulating spacers 930 may be formed by oxidizing the remaining second material layers 910B except the uppermost second material layer 910B. The insulating spacers 930 may each have a third thickness T3'. The third thickness T3' may be substantially the same as or different from the first thickness T1' or the second thickness T2'. For example, the third thickness T3' may be substantially the same as the second thickness T2'. As another example, the third thickness T3' may be smaller than the second thickness T2'.

Channel structures 920 that extend through the stack 910 may be formed. Each of the channel structures 920 may include a channel layer 920A, a memory layer 920B that surrounds the channel layer 920A, or an insulating core 920C within the channel layer 920A.

Referring to FIGS. 18A and 18B, the first openings OP1 may be extended. For example, the first part OP1A may be extended to neighbor the uppermost second material layer 910B. The first opening OP1 may be extended by selectively etching the sidewall of the first part OP1A. Accordingly, the first part OP1A may have a cross section having a taper shape. The uppermost second material layer 910B may be exposed by selectively etching the sidewall of the first part OP1A. When the sidewall of the first part OP1A is selectively etched, the insulating spacers 930 can prevent the remaining second material layers 910B from being exposed.

Referring to FIGS. 19A and 19B, contact plugs 940 may be formed within the first openings OP1, respectively. The second material layers 910B may be substituted with third material layers 910C. For example, through a slit SL, the second material layers 910B may be removed and the third material layers 910C may be formed. The third material layers 910C may include a first conductive layer 910C1 to an n-th conductive layer 910Cn. In this case, n may be an integer equal to or greater than 3. The n-th conductive layer 910Cn may mean a material layer in which the uppermost second material layer 910B has been substituted with the third material layer 910C. The first conductive layer 910C1 to the (n−1)-th conductive layer 910Cn-1 may mean material layers in which the remaining second material layers 910 have been substituted with the third material layers 910C, respectively. Accordingly, the contact plugs 940 may each include a part that is electrically connected to the n-th conductive layer 910Cn and parts that extend through the first conductive layer 910C1 to the n-th conductive layer 910Cn, respectively. Furthermore, the contact plugs 940 may each include a sidewall that is inclined toward the n-th conductive layer 910Cn. A slit structure 950 may be formed within the slit SL.

The third material layers 910C may each have a fourth thickness T4'. The fourth thickness T4' may be substantially the same as or different from each other the first thickness T1', the second thickness T2', or the third thickness T3'. For example, the fourth thickness T4' may be substantially the same as the second thickness T2'. The fourth thickness T4' may be substantially the same as or different from the third thickness T3'. The fourth thickness T4' may be smaller than the third thickness T3'.

Referring back to 14A, 14B, 15A, 15B, 16A, and 16B, a process of exposing the contact plugs 840 by extending second openings OP2 that have been formed by removing the second material layers 810B may be performed. In contrast, in the present embodiment, a process of exposing the contact plugs 940 by separately extending the second openings OP2 might not be performed because the uppermost second material layer 910B has already been exposed by the first openings OP1. Accordingly, the second thickness T2', the third thickness T3', and the fourth thickness T4' may be substantially the same. However, the present disclosure is not limited to such an example. In order to improve electrical connectivity, the contact plugs 940 may be exposed by extending the second openings OP2.

According to the aforementioned process, the uppermost second material layer 910B may be exposed by the first part OP1A of the first openings OP1 having the taper shape. Accordingly, a process of extending the second openings OP2 in order to expose the contact plugs 940 may be omitted.

Furthermore, in the present embodiment, the insulating spacers 930 may each be formed to have a small thickness and width compared to the aforementioned embodiments because the process of separately extending the second openings OP2 can be omitted. Accordingly, the third thickness T3' of each of the insulating spacers 930 may be formed to be smaller than the second thickness T2' of each of the second material layers 910B or the fourth thickness T4' of each of the third material layers 910C.

Although embodiments according to the technical spirit of the present disclosure have been described above with reference to the accompanying drawings, the embodiments have been provided to merely describe embodiments according to the concept of the present disclosure, and the present disclosure is not limited to the embodiments. A person having ordinary knowledge in the art to which the present disclosure pertains May substitute, modify, and change the embodiments in various ways without departing from the technical spirit of the present disclosure written in the claims. Such substitutions, modifications, and changes may be said to belong to the scope of the present disclosure.

What is claimed is:

1. A method of manufacturing a semiconductor device, comprising:
    forming a stack comprising interleaved first material layers and second material layers;
    forming a stair structure that exposes at least one of the second material layers;
    forming a first opening that is spaced apart from an end of a uppermost second material layer that is exposed by the stair structure and that extends into the stack;

forming an insulating spacers by oxidizing a surface of the second material layers exposed through the first opening;

forming a contact plug within the first opening;

forming a second openings by removing the second material layers, exposing the contact plug by extending the second openings; and forming a third material layers within the second openings.

2. The method of claim 1, wherein the exposing of the contact plug comprises exposing a portion of a sidewall of the contact plug by extending the second opening that is formed by removing the uppermost second material layer.

3. The method of claim 1, wherein exposing contact plug comprises selectively etching the first material layers exposed through the second openings.

4. The method of claim 1, further comprising extending the first opening after forming the insulating spacers.

5. The method of claim 1, further comprising:

forming a third opening that extends orthogonal to and into the stack; and forming a channel structure within the third opening.

6. The method of claim 5, wherein the third opening is formed substantially simultaneously with the first opening formation.

7. The method of claim 1, further comprising:

forming a slit that extends into the stack; and forming a slit structure within the slit.

8. The method of claim 7, wherein the second openings are formed by removing the second material layers through the slit.

9. The method of claim 1, wherein:

the first material layers each have a first thickness, and the second material layers each have a second thickness less than the first thickness.

10. The method of claim 1, wherein:

the first material layers each have a first thickness, and the insulating spacers each have a third thickness less than the first thickness.

11. The method of claim 1, wherein:

the insulating spacers each have a third thickness, and the third material layers each have a fourth thickness greater than the third thickness.

12. The method of claim 1, wherein the insulating spacers protrude into the contact plug.

* * * * *